(12) United States Patent
Park et al.

(10) Patent No.: US 9,478,592 B2
(45) Date of Patent: Oct. 25, 2016

(54) THIN FILM TRANSISTOR ARRAY SUBSTRATE

(71) Applicant: LG Display Co., Ltd., Seoul (KR)

(72) Inventors: Kyoung Jin Park, Paju-si (KR); Ki Soub Yang, Paju-si (KR); Seung Ryul Choi, Goyang-si (KR); Kang Hyun Kim, Paju-si (KR); Sam Jong Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/935,159

(22) Filed: Nov. 6, 2015

(65) Prior Publication Data

US 2016/0155786 A1    Jun. 2, 2016

(30) Foreign Application Priority Data

Nov. 28, 2014  (KR) .......................... 10-2014-0169057

(51) Int. Cl.
*H01L 27/32* (2006.01)
*H01L 51/56* (2006.01)
*H01L 51/00* (2006.01)

(52) U.S. Cl.
CPC ......... *H01L 27/3246* (2013.01); *H01L 27/322* (2013.01); *H01L 51/0005* (2013.01); *H01L 51/56* (2013.01); *H01L 2251/558* (2013.01)

(58) Field of Classification Search
CPC .............................. H01L 27/32; H01L 51/56
USPC .......................................................... 257/40
See application file for complete search history.

(56) References Cited

U.S. PATENT DOCUMENTS

2005/0057151 A1*  3/2005  Kuwabara .............. H05B 33/22
                                                    313/506
2005/0073243 A1*  4/2005  Yamazaki ........... H01L 27/3246
                                                    313/498

* cited by examiner

*Primary Examiner* — Asok K Sarkar
*Assistant Examiner* — Dmitriy Yemelyanov
(74) *Attorney, Agent, or Firm* — Borch, Stewart, Kolasch & Birch, LLP

(57) ABSTRACT

An organic light emitting diode (OLED) display device, and a method for manufacturing the OLED display device are discussed. The OLED display device according to one embodiment includes a substrate; a first bank pattern formed on the substrate and in an emission region and a non-emission region; a second bank pattern formed on the first bank pattern; an organic emission layer formed on the substrate in the emission region; and a planarization film formed on the substrate to include an opening under the first and second bank patterns in the non-emission region. The second bank pattern is on the first bank pattern in the non-emission region, and the first bank pattern is in the opening of the planarization film in the non-emission region.

11 Claims, 8 Drawing Sheets

THIN FILM TRANSISTOR ARRAY SUBSTRATE

The present application claims priority under 35 U.S.C. §119(a) of Korean Patent Application No. 10-2014-0169057 filed on Nov. 28, 2014 which is hereby incorporated by reference in its entirety.

BACKGROUND

1. Field of the Invention

The present application relates to a thin film transistor array substrate, and more particularly to a thin film transistor array substrate adapted to prevent the generation of thickness deviations in an organic emission layer which is included in an organic light emitting diode (OLED) display device with the thin film transistor array substrate.

2. Description of the Related Art

Display devices include display devices with backlight units and OLED display devices using self-luminous elements that do not require a separated backlight unit. In accordance therewith, an OLED display device using a self-luminous element can be thin and have low power consumption.

The OLED display device can include an organic light emitting element including an anode electrode, a cathode electrode and an organic emission layer interposed between the two electrodes. An organic light emitting element enables generation of excitons by recombining holes and electrons from the anode and cathode electrodes into the organic emission layer. Also, the organic light emitting element emits light by the excitons transitioning from an excited state to a stable state.

The organic emission layer can be formed using a vapor deposition method. An ink-jet printing process can be used to form the organic emission layer on a large-sized substrate by dropping a liquefied organic emission material.

Such an organic emission layer has thicker edge areas adjacent to a bank pattern compared to a central area surrounded by the bank pattern. This results from the fact that the edge portion of the organic emission layer is hardened at a slower speed than a hardening speed of the central portion of the organic emission layer; and an organic emission material is internally removed from the central area of the organic emission layer to the edge area of the organic emission layer due to a hardening phenomenon of the organic emission material progresses from the central area to the edge area of the organic emission layer.

BRIEF SUMMARY

Embodiments of the present application are directed to a thin film transistor array substrate that substantially obviates one or more of problems due to the limitations and disadvantages of the related art. A thin film transistor array substrate according to one embodiment is adapted to reduce the thickness of an organic emission layer and prevent the non-uniform formation of the organic emission layer to externally expose a color filter layer. The exposed color filter layer is disposed under a planarization film, through the planarization film within a non-emission region.

Additional features and advantages of the embodiments will be set forth in the description which follows, and in part will be apparent from the description, or can be learned by practice of the embodiments. The advantages of the embodiments will be realized and attained by the structure particularly pointed out in the written description and claims hereof as well as the appended drawings.

To solve the above-mentioned problems, a thin film transistor array substrate according to a general aspect of the present embodiment includes a substrate including an emission region and a non-emission region, a color filter layer disposed on the substrate, a planarization layer disposed on the color filter layer and configured to remove at least a part of the non-emission region corresponding to the planarization layer. The thin film transistor array substrate also includes a first electrode disposed on a part of the planarization film, a first bank pattern configured to expose a part of an upper surface of the first electrode and expand up to the non-emission region. The thin film transistor array substrate also includes a second bank pattern disposed on the first bank pattern within the non-emission region. As a result, the thin film transistor array substrate reduces the thickness of the second bank pattern to uniformly form an organic emission layer.

Other systems, methods, features and advantages will become, apparent to one with skill in the art upon examination of the following figures and detailed description. The systems, methods, features and advantages included within this description are within the scope of the present invention, and are protected by the following claims. Nothing in this section should be taken as a limitation on those claims. Further aspects and advantages are discussed below in conjunction with the embodiments. It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the embodiments and are incorporated herein and constitute a part of this application, illustrate embodiments of the present invention and together with the description serve to explain the invention. In the drawings.

DETAILED DESCRIPTION OF THE INVENTION

Reference will now be made in detail to embodiments of the present invention, examples of which are illustrated in the accompanying drawings. These embodiments introduced hereinafter are provided as examples to convey the spirit of the invention to the ordinary skilled person in the art. The invention is not limited to the embodiments described here. The size, thickness and so on of a device as shown in the embodiments are provided for convenience of explanation. Wherever possible, the same reference numbers are used throughout this disclosure including the drawings to refer to the same or like parts.

Figure 1:
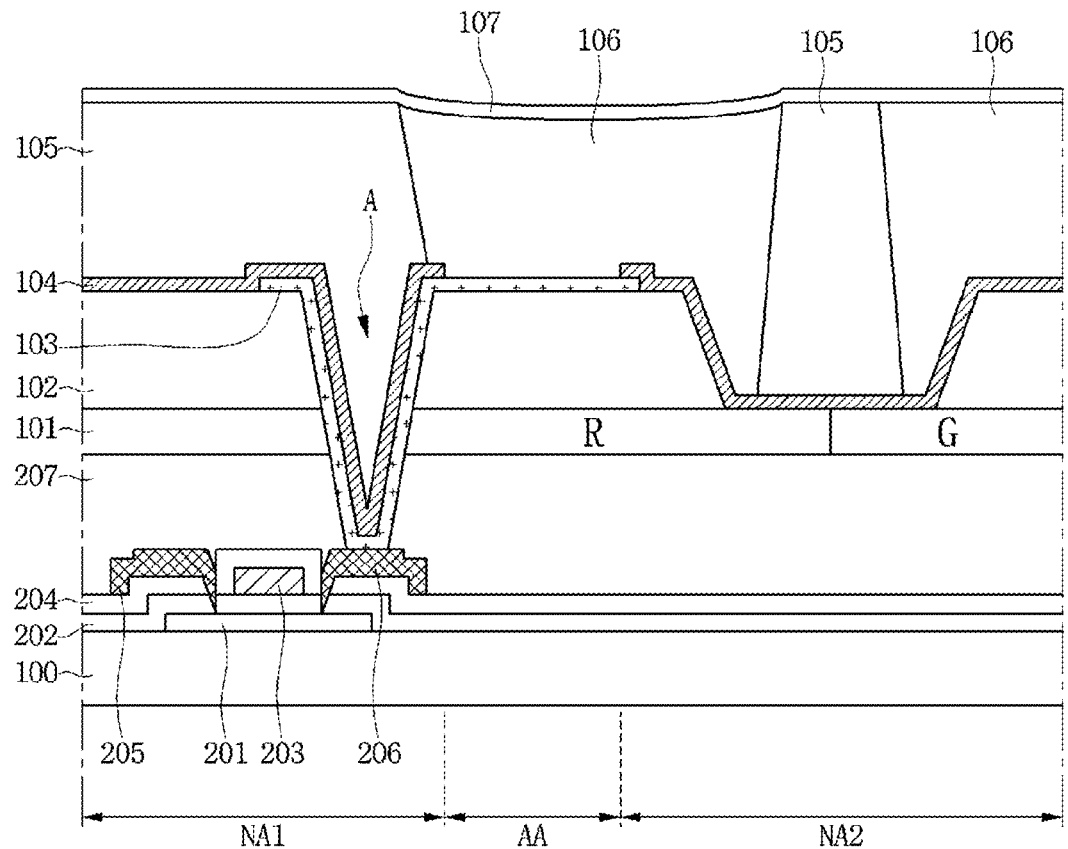
FIG. 1 is a cross-sectional view showing a thin film transistor array substrate of an OLED device according to a first embodiment of the present invention.
Figure 2:
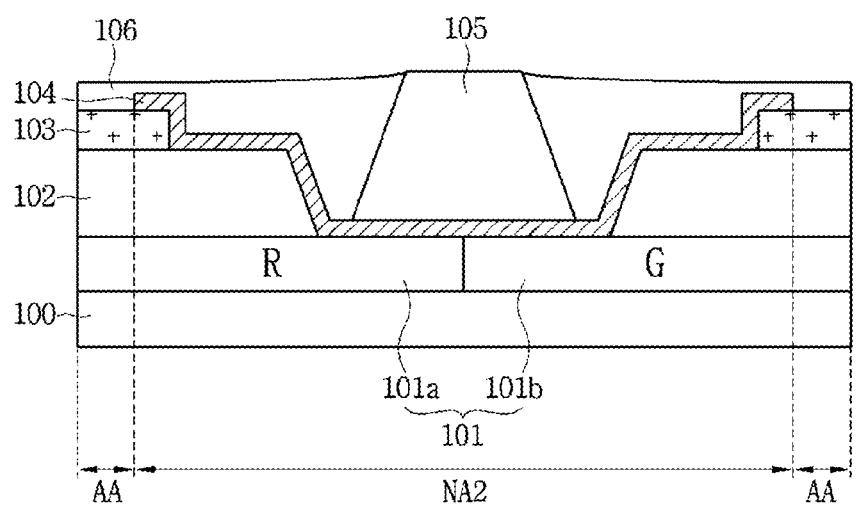
FIG. 2 is a cross-sectional view showing a non-emission region of the thin film transistor array substrate according to the first embodiment.

FIGS. 1 and 2 illustrate a thin film transistor array substrate of an OLED display device according to a first embodiment of the present invention. In further detail, FIG. 1 is a cross-sectional view showing a thin film transistor array substrate of an OLED display device according to the first embodiment of the present invention; and FIG. 2 is a cross-sectional view largely showing a non-emission region of a thin film transistor array substrate according to the first embodiment. The thin film transistor array substrate of an OLED display device according to the first embodiment of the present invention can include, for example, a thin film transistor, a color filter layer 101 and an organic light emitting element.

The thin film transistor includes a semiconductor layer 201, a gate insulation film 202, a gate electrode 203, an inter-layer insulation film 204, a source electrode 205, a drain electrode 206, and a buffer layer 207. The color filter layer 101 includes a red color filter pattern 101a, a green color filter pattern 101b and a blue color filter pattern. The organic light emitting element includes a first electrode 103, an organic emission layer 106 and a second electrode 107. The organic emission layer 106 can be formed by jetting or dropping a liquefied organic emission material into a region surrounded with a second bank pattern 105 using one of a spin coating method, an ink-jet method and a slot die method and then hardening the jetted or dropped organic emission material.

Because, in the related art, an organic emission layer must be formed to have a thicker edge portion adjacent to the bank pattern compared to the central portion within the region surrounded by the bank pattern, an aperture ratio of the OLED display device must become lower. To improve the aperture ratio of the OLED display device, the upper surface of an organic emission layer can be flattened throughout an entire region including an edge region adjacent to a bank pattern. The flattening of the upper surface of an organic emission layer can form a first bank pattern and a second bank pattern disposed on the first bank pattern. In this case, the second bank pattern disposed on the first bank pattern must be thickened. As a result, the thickened second bank pattern can cause an etchant to intrude between the first and the second bank patterns during a photolithography process. In particular, in related art, the photolithography process which is used for patterning the second bank pattern can cause generation of a curling phenomenon of the second bank pattern and deterioration of the flatness of the organic emission layer. The curling phenomenon of the second bank pattern can be generated due to the second bank pattern having a very large thickness in a contact hole which is formed in a planarization film and used to connect a first electrode of the organic light emitting element and the drain electrode of the thin film transistor.

To address this matter, the OLED display device according to the first embodiment of the present disclosure disposes a planarization film 102 on regions of the color filter layer 101 not including a boundary region between color filter patterns different from each other within a second non-emission region NA2. Also, a second bank pattern 105 is disposed in the boundary region between the color filter patterns different from each other. As such, the thickness of the second bank pattern 105 can decrease.

In further detail, the thin film transistor array substrate of the OLED display device according to the first embodiment of the present invention includes the color filter layer 101 disposed on a substrate 100 which is defined into an emission region AA and first and second non-emission regions NA1 and NA2. As such, a thin film transistor array substrate of the OLED display device according to the first embodiment of the present invention is defined into the emission region AA and the first and second non-emission regions NA1 and NA2. The first non-emission region NA1 is used as a driver region in which the thin film transistor is disposed. The second non-emission region NA2 is a pixel region that does not emit light and does not include the thin film transistor.

The planarization film 102 is disposed on the substrate 100 provided with the color filter layer 101 (refer to FIG. 3C), but the planarization film 102 cannot be disposed in the boundary region between the color filter patterns different from each other. For example, the planarization film 102 cannot be disposed in a boundary region between a red color filter pattern 101a and a green color filter pattern 101b. Also, the planarization film 102 cannot be disposed in a boundary region between the green color filter pattern 101b and a blue color filter pattern. Also, the planarization film 102 cannot be disposed in a boundary region between the blue color filter pattern and the red color filter pattern 101a.

In other words, an opening can be formed in the planarization film 102 within the second non-emission region NA2 to separate the planarization film in two portions. The opening can be formed by removing a part of the planarization film 102 from one boundary between the different color filter patterns. For example, the opening formed in the planarization film 102 can expose the boundary between the red color filter pattern 101a and the green color filter pattern 101b. Or, the opening can be formed in a boundary between the green color filter pattern 101b and the blue color filter pattern. Also, the opening can be formed in a boundary between the blue color filter pattern and the red color filter pattern 101a.

The first electrode 103 of the organic light emitting element can be disposed on the planarization film 102 within the emission region AA. Such a first electrode 103 can be used as an anode electrode. Alternatively, the first electrode 103 can be used as a cathode electrode. Hereinafter, the first electrode 103 used as the anode electrode will be described in the first embodiment.

Also, the first electrode 103 can be formed in a single layer using a relatively high transparent conductive material. As such, a bottom emission type OLED display device emitting light from the second electrode of the organic light emitting element toward the first electrode 103 of the organic light emitting element can be implemented. Alternatively, a reflection layer disposed under the first electrode 103 can further be included in the OLED display device. In accordance therewith, a top emission type OLED display device reflects light, which is emitted from the second electrode toward the first electrode 103, and outputs light in an upward direction. Alternatively, the first electrode 103 can be formed in a multi-layered structure.

For example, the first electrode 103 can be formed in a triple-layered structure including a first layer, a second layer disposed on the first layer and a third layer disposed on the second layer. In this case, the first layer and the third layer can be each formed from a transparent conductive material. The transparent conductive material can be one of indium-tin-oxide (ITO) and indium-zinc-oxide (IZO). The second layer can be a reflection layer, and one of a metal layer and a metal-alloy layer. For example, the second layer can be one of a silver layer and a metal-alloy layer including silver Ag. Therefore, the top emission type OLED display device reflecting light, which is emitted from the second electrode toward the first electrode 103, in an upward direction can be implemented.

A first bank pattern 104 is disposed on the first and second non-emission regions NA1 and NA2 of the substrate 100 provided with the first electrode 103 of the organic light emitting element. The first bank pattern 104 can be formed in such a manner as to cover edges of the first electrode 103. In other words, the first bank pattern 104 can be disposed to expose a part of the upper surface of the first electrode 103 corresponding to the emission region AA. As such, a current concentration in the edge portion of the first electrode 103 can be prevented.

Such a first bank pattern 104 is disposed on the edges of the first electrode 103. Also the first bank pattern 104 can be disposed in the opening exposing a boundary between the color filter patterns different from each other within the second non-emission region NA2 by expending from one edge of the first electrode 103 of an organic light emitting element up to the second non-emission region NA2. A second bank pattern 105 can be disposed in such a manner as to overlap with the first bank pattern 104 disposed in the opening. In other words, the first bank pattern 104 can be disposed in the opening and the second bank pattern 105 can be disposed on the first bank pattern 104 opposite to the opening.

In this manner, not only the opening is formed by two portions of the planarization film 102 being separated from and disposed adjacently to each other. The first bank pattern 104 and also the second bank pattern 105 are disposed in the opening. As such, the second bank pattern 105 disposed above the planarization film 102 can be formed to have a smaller height (or a smaller thickness) compared to that of the related art.

Also, the second bank pattern 105 is disposed in a contact hole which is formed in the planarization film 102 and used to connect the first electrode 103 and the drain electrode 206. The second bank pattern 105 disposed in the contact hole can have a smaller height (or a smaller thickness). Due to the second bank pattern 105 having a smaller thickness, a curling phenomenon of the second bank pattern 105 in a photolithography process which is used to pattern the second bank pattern 105 can be prevented.

The organic emission layer 106 is disposed on the substrate 100 provided with the first bank pattern 104 and the second bank pattern 105. In detail, the organic emission layer 106 can be disposed a region (i.e., the emission region AA) surrounded by the second bank pattern 105. Such an organic emission layer 106 can be formed using a liquefied organic emission material. The liquefied organic emission material used in the formation of the organic emission layer 106 can allow a large-sized OLED display device to be easily implemented.

To enhance light emission efficiency, the organic emission layer 106 can be formed in a multi-layered structure including a hole injection layer, a hole transport layer, an emission material layer, an electron transport layer and an electron injection layer. The organic emission layer 106 with the multi-layered structure can be formed by stacking alternately a hydrophilic organic emission layer with a hydrophobic organic emission layer.

In this case, the first bank pattern 104 can be formed from a hydrophilic material. For example, the first bank pattern 104 can be formed from an inorganic material. Preferably, the first bank pattern 104 can be formed from a silicon oxide SiO2. Also, the second bank pattern 105 can be formed from a hydrophobic material. For example, the second bank pattern 105 can be formed from an organic material.

In accordance therewith, the hydrophilic organic emission material can be coated on the first bank pattern 104 in a uniform thickness. Also, the second bank pattern 105 formed from the hydrophobic material has a property of thrusting the organic emission material. As such, an overflow of the liquefied organic emission material can be prevented. The second bank pattern 105 with hydrophilicity can be disposed in such a manner as to expose a part of the upper surface of the first bank pattern 104 with hydrophobicity. In other words, the second bank pattern 105 can be formed to have a narrower width than that of the first bank pattern 104. As such, a spread phenomenon of the organic emission material can be prevented.

The thin film transistor array substrate of the OLED display device according to the first embodiment of the present invention includes the planarization film 102 with the opening exposing the boundary between the color filter patterns different from each other within the second non-emission region NA2. As such, the second bank pattern 105 of hydrophobicity disposed in the opening can be formed in a low height (or a small thickness). Also, the second bank pattern 105 disposed above the contact hole A, which is used to connect the first electrode 103 and the drain electrode 206, can have a small thickness (or a low height). In accordance therewith, the generation of the curling phenomenon of the second bank pattern 105 due to an etchant used in a photolithography process can be prevented. Moreover, since the second bank pattern 105 is thinned, the organic emission layer 106 can be formed in a uniform thickness.

Figure 3A:
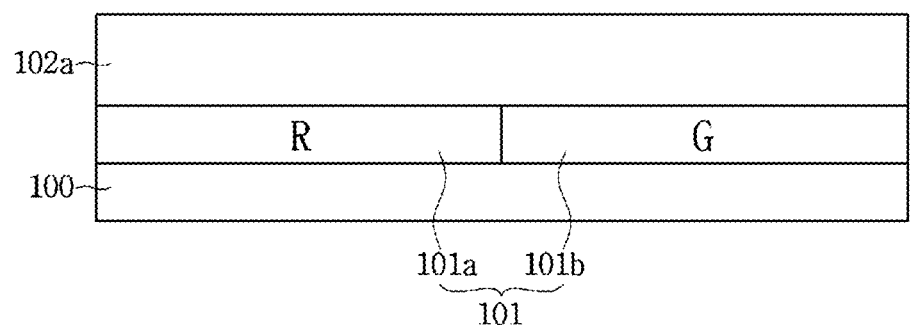
FIGS. 3A through 3C are cross-sectional views illustrating a method of fabricating a thin film transistor array substrate of an OLED display device according to the first embodiment.
Figure 3B:
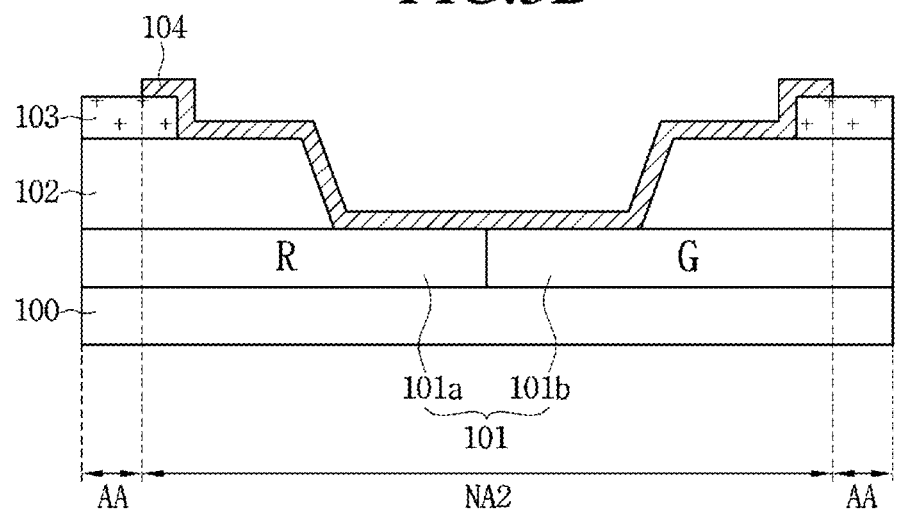
Figure 3C:
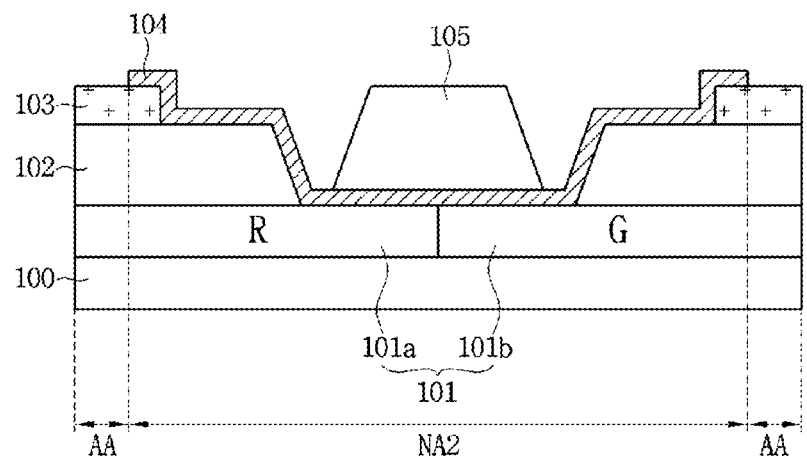

FIGS. 3A through 3C illustrate, subsequently, a method of fabricating a thin film transistor array substrate of an OLED display device according to the first embodiment of the present invention. In further detail, FIGS. 3A through 3C are cross-sectional views illustrating a method of fabricating a thin film transistor array substrate of an organic light emitting diode display device according to the first embodiment of the present invention.

Referring to FIG. 3A, a color filter layer 101 is formed on a substrate 100 and includes a red color filter pattern 101a, a green color filter pattern 101b and a blue color filter pattern. In particular, a red resin film is formed on the substrate 100. Then, the red resin film is patterned through a photolithography process. In accordance therewith, the red color filter pattern 101a can be formed on the substrate 100. Also, a green resin film is formed on the substrate 100 provided with the red color filter pattern 101a. Then, the green resin film is patterned through the photolithography process. In accordance therewith, the green color filter pattern 101b can be formed on the substrate 100. Moreover, a blue resin film is formed on the substrate 100 provided with the red and green color filter patterns 101*a* and 101*b*. Then, the blue resin film is patterned through the photolithography process. In accordance therewith, the blue color filter pattern can be formed on the substrate 100. The red color filter pattern 101*a*, the green color filter pattern 101*b* and the blue color filter pattern can be arranged alternately with one another.

Meanwhile, a black matrix can be formed on the substrate 100 using the photolithography process before the color filter layer 101 is formed. A planarization material film 102*a* is formed on the substrate 100 provided with the color filter layer 101.

Referring to FIG. 3B, a photoresist material film is formed on the planarization material film 102*a* (refer to FIG. 3A). The photoresist material film can be a photosensitive material which can be cured through light irradiation. Subsequently, a photoresist pattern is formed by performing exposure and development processes for the photoresist material film using a mask with a transmission portion and an interception portion. Then, the planarization material film 102*a* is etched using the photoresist pattern as an etch mask, thereby forming a planarization film 102.

The planarization film 102 cannot be disposed on (or can be removed from) a boundary between the color filter patterns different from each other. In other words, the planarization film 102 can be formed in such a manner as to be separated into at least two portions. As such, a portion of the planarization film 102 and another portion of the planarization film 102 separated from each other can be disposed adjacently to each other. As the planarization film 102 is not disposed on the boundary between the color filter patterns different from each other, an opening (or an opening gap) exposing the boundary between the different color filter patterns can be formed in the planarization film 102.

Then, a first electrode material layer is formed on the substrate 100 provided with the planarization film 102. The first electrode material layer can be patterned into a first electrode 103 by being etched through a photolithography process. Such a first electrode 103 can be disposed on the planarization film 103. Afterward, a first bank material film is formed on the substrate 100 in which the first electrode 103 is formed. The first bank material can be a hydrophilic material.

The first bank material film is patterned into a first bank pattern 104 by being etched through the photolithography process. The first bank pattern 104 can be disposed in such a manner as to not only expose a part of the upper surface of the first electrode 103 within the emission region AA but also cover the opening within the second non-emission region NA2.

Referring to FIG. 3C, subsequently, a second bank material film is formed on the substrate 100 provided with the first bank pattern 104. The second bank material can be a hydrophobic material. Thereafter, the second bank material film is patterned into a second bank pattern 105 by being etched through the photolithography process. The second bank pattern 105 is disposed on the first bank pattern 104 covering the opening within the second non-emission region NA2.

In this way, the opening exposing the boundary between the color filter patterns different from each other within the second non-emission region NA2 is formed in the planarization film 102. As such, the second bank pattern 105 of hydrophobicity disposed above the opening can be lowered in height (or thinned in thickness). In accordance therewith, the generation of the curling phenomenon of the second bank pattern 105 due to an etchant, which is used in the photolithography process patterning the second bank pattern, can be prevented.

Figure 4:
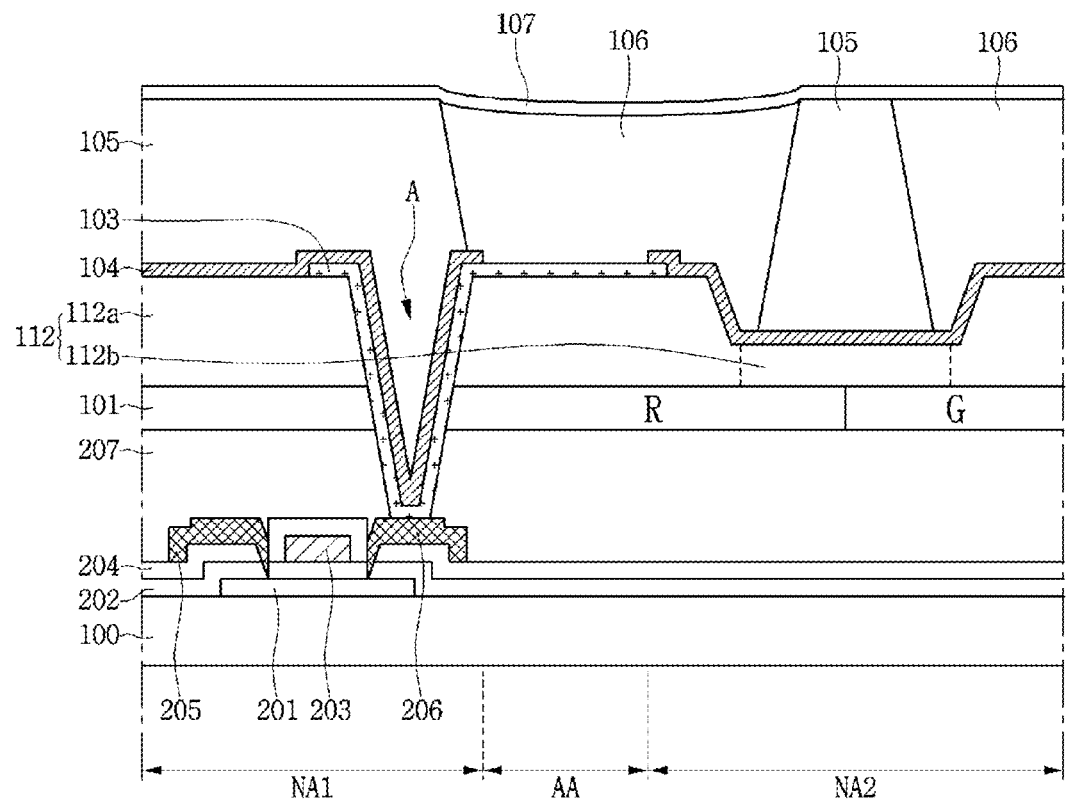
FIG. 4 is a cross-sectional view showing a thin film transistor array substrate of an OLED display device according to a second embodiment of the present invention.
Figure 5:
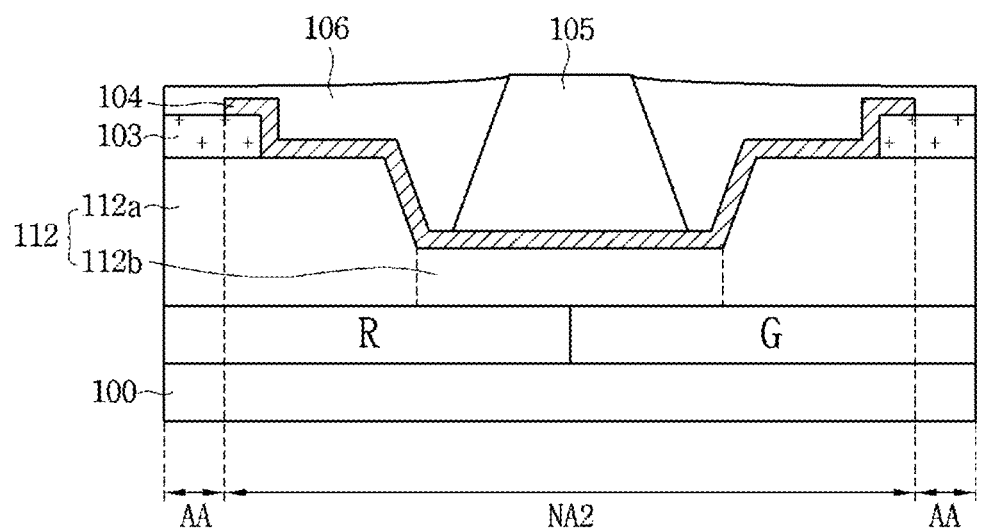
FIG. 5 is a cross-sectional view largely showing a non-emission region of the thin film transistor array substrate according to the second embodiment.

FIGS. 4 and 5 illustrate a thin film transistor array substrate of an OLED display device according to a second embodiment of the present invention. In further detail, FIG. 4 is a cross-sectional view illustrating a thin film transistor array substrate of an OLED display device according to the second embodiment of the present invention; and FIG. 5 is a cross-sectional view largely illustrating a non-emission region of the thin film transistor array substrate according to the second embodiment. A thin film transistor array substrate of the OLED display device of the second embodiment can have the same components as that of the previous embodiment. As such, the description of the second embodiment overlapping with the previously described embodiment will be omitted. Also, the components of the second embodiment being the same shape and function as those of the previous embodiment will be referred to by the same reference numbers and names.

Referring to FIGS. 4 and 5, a thin film transistor array substrate of an OLED display device according to the second embodiment of the present invention includes a thin film transistor, a color filter layer 101 and an organic light emitting element. The thin film transistor includes a semiconductor layer 201, a gate insulation film 202, a gate electrode 203, an inter-layer insulation film 204, a source electrode 205 and a drain electrode 206. The color filter layer 101 includes a red color filter pattern 101*a*, a green color filter pattern 101*b* and a blue color filter pattern. The organic light emitting element includes a first electrode 103, an organic emission layer 106 and a second electrode 107.

In detail, the color filter layer 101 is disposed on a substrate 100 which is defined into an emission region AA and first and second non-emission regions NA1 and NA2. The color filter layer 101 includes the red color filter pattern 101*a*, the green color filter pattern 101*b* and the blue color filter pattern 101*c*.

A planarization film 112 is disposed on the substrate 100 provided with color filter layer 101. The planarization film 112 includes a first planarization film 112*a* and a second planarization film 112*b*. The first planarization film 112*a* is not disposed on a boundary between the color filter patterns different from each other within the second non-emission region NA2. Meanwhile, the second planarization film 112*b* is disposed on the boundary between the different color filter patterns within the second non-emission region NA2. In other words, the second planarization film 112*b* is disposed in a region being not occupied by the first planarization film 112*a*. Also, the first planarization film 112*a* can be formed to have a higher height (or a larger thickness) than that of the second planarization film 112*b*. As such, a recess (or a depressed portion) is formed in the planarization film 112 within the second non-emission region NA2.

The first electrode 103 of the organic light emitting element can be disposed on the first planarization film 112*a* within the emission region AA. The first electrode 103 can be used as an anode electrode. Such a first electrode 103 can be formed in a multi-layered structure without being limited to a structure shown in the drawings. Meanwhile, the organic light emitting element can further include a reflection layer disposed under the first electrode 103.

A first bank pattern 104 can be disposed on the second planarization film 112*b* within the second non-emission region NA2 of the substrate 100 provided with the first electrode 103 of the organic light emitting element. The first bank pattern 104 can be disposed in such a manner as to cover an edge of the first electrode 103.

In detail, the first bank pattern 104 can be disposed in such a manner as to not only expose a part of the upper surface of the first electrode 103 within the emission region AA but also expand from one edge of the first electrode 103 up to the second non-emission region NA2. In other words, the first bank pattern 104 can be disposed in such a manner as to overlap with the second planarization film 112b within the second non-emission region NA2.

A second bank pattern 105 is disposed on the first bank pattern 104 overlapping with the second planarization film 112b within the second non-emission region NA2. The second bank pattern 105 can be formed to have a small thickness (or a lowered height) because of being disposed on the second planarization film 112b with a low height (or in the recess of the planarization film 112).

Also, the height of the second bank pattern 104 formed in a contact hole A, which is formed in the planarization film 112 and used to connect the first electrode 103 and the drain electrode 206, can be lowered. As such, the generation of a curling phenomenon of the second bank pattern 105 due to an etchant, which is used in the photolithograph process for patterning the second bank pattern 105, can be prevented.

The organic emission layer 106 is disposed on the substrate 100 provided with the second bank pattern 105. The organic emission layer 106 can be disposed in a region surrounded by the second bank pattern 105.

In this manner, the second bank pattern 105 is disposed in the recess of the planarization film 112 (or on the second planarization film 112b with the lowered height) within the second non-emission region NA2. As such, the second bank pattern 105 can be formed to have a small thickness (or a lowered height). In accordance therewith, the organic emission layer 106 can also be formed to a flattened (planarized) surface.

To enhance light emission efficiency, the organic emission layer 106 can be formed in a multi-layered structure including a hole injection layer, a hole transport layer, an emission material layer, an electron transport layer and an electron injection layer. The organic emission layer 106 with the multi-layered structure can be formed by stacking alternately a hydrophilic organic emission layer with a hydrophobic organic emission layer.

In this case, the first bank pattern 104 can be formed from a hydrophilic material. For example, the first bank pattern 104 can be formed from an inorganic material. Preferably, the first bank pattern 104 is formed from a silicon oxide SiO2.

Meanwhile, the second bank pattern 105 disposed on the first bank pattern 104 within the second non-emission region NA2 can be formed from a hydrophobic material. For example, the second bank pattern 105 can be formed from an organic material. Also, the second bank pattern 105 with hydrophobicity can be disposed in such a manner as to expose a part (edges) of the upper surface of the first bank pattern 104 with hydrophilicity. In other words, the second bank pattern 105 can be formed to have a narrower width than that of the first bank pattern 104. In accordance therewith, a spread phenomenon of the organic emission material can be prevented.

The thin film transistor array substrate of the OLED display device according to the second embodiment of the present invention includes the second planarization film 112b with the lowered height being disposed in the second non-emission region NA2. In other words, the thin film transistor array substrate can enable the recess (or the depressed portion) to be formed in the planarization film 112 within the second non-emission region NA2. As such, the height (or thickness) of the second bank pattern 105 can be lowered (or become smaller). In accordance therewith, the organic emission layer 106 can be formed to have a flattened (or planarized) surface. Also, the height of the second bank pattern 105 disposed in the contact hole A which is formed in the planarization film 112 can be lowered. Therefore, the generation of the curling phenomenon of the second bank pattern 105 due to an etchant used in a photolithography process can be prevented.

Figure 6A:
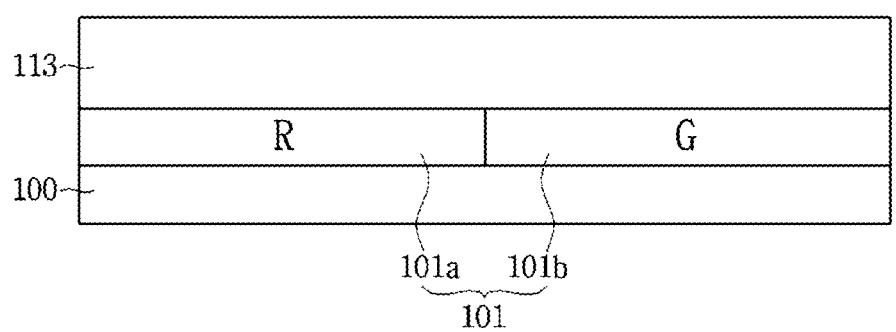
FIGS. 6A through 6C are cross-sectional views illustrating a method of fabricating a thin film transistor array substrate of an OLED display device according to the second embodiment of the present invention.
Figure 6B:
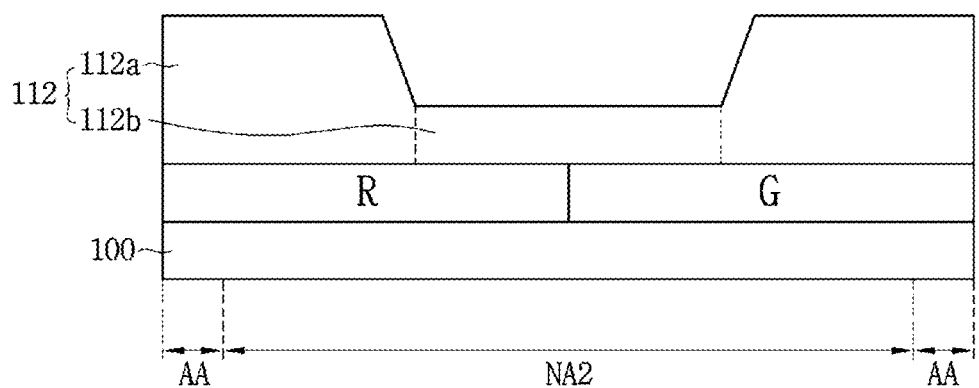
Figure 6C:
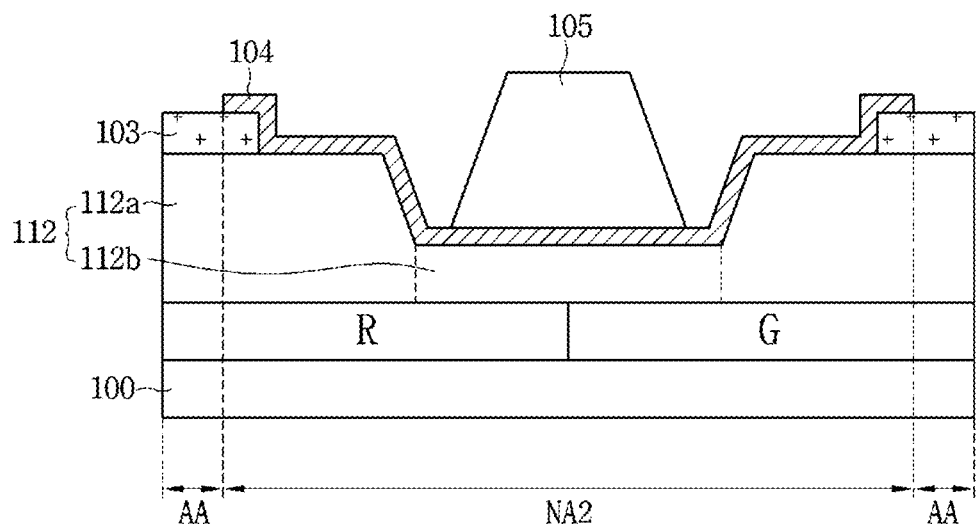

FIGS. 6A through 6C illustrate, continuously, a method of fabricating a thin film transistor array substrate of an OLED display device according to the second embodiment of the present invention. In further details, FIGS. 6A through 6C are cross-sectional views illustrating a method of fabricating a thin film transistor array substrate of an OLED display device according to the second embodiment of the present invention. The thin film transistor array substrate of the OLED display device of the second embodiment can have the same components as that of the previous embodiment. As such, the description of the second embodiment overlapping with the previously described embodiment will be omitted. Also, the components of the second embodiment being the same shape and function as those of the previous embodiment will be referred to by the same reference numbers and names.

Referring to FIG. 6A, a color filter layer 101 is formed on a substrate 100 using a photolithography process. The color filter layer 101 includes a red color filter pattern 101a, a green color filter pattern 101b and a blue color filter pattern. Also, a black matrix can be formed on the substrate 100 using the photolithography process before the color filter layer 101 is formed. A planarization material film 102a is formed on the substrate 100 in which the color filter layer 101 is formed.

Referring to FIG. 6B, a negative photoresist material film is formed on the planarization material film. The photoresist material film can be a photosensitive material which can be cured through light irradiation. Also, a photoresist pattern is formed by performing exposure and development processes for the photoresist material film using a mask with a transmission portion, a semi-transmission portion and an interception portion. The transmission portion of the mask transmits light without changing any characteristics of the light. The semi-transmission portion of the mask transmits a smaller quantity of light compared to the transmission portion, and the interception portion of the mask completely intercepts light.

As such, a portion of the photoresist material film opposite to the semi-transmission portion of the mask can be semi-cured by being exposed to light. Also, another portion of the photoresist material film opposite to the transmission portion of the mask can be completely cured by being exposed to light.

In accordance therewith, one portion of the photoresist material film opposite to the transmission portion of the mask can become one photoresist pattern disposed on a first planarization film with a high height after the semi-curing of the photoresist material film. Also, another portion of the photoresist material film opposite to the semi-transmission portion of the mask can become another photoresist pattern disposed on a second planarization film with a low height after the semi-curing of the another photoresist material film. Moreover, still another portion of the photoresist material film opposite to the interception portion of the mask is completely removed from the planarization material film and exposes the planarization material film. Alternatively, the photoresist material film can be formed from a positive photoresist material. In this case, a mask must be fabricated in an inverse pattern unlike the above-mentioned mask.

The exposed planarization material film is etched using a photoresist pattern, which is formed in a region opposite to the transmission and semi-transmission portions of the mask, as an etch mask. At this time, the planarization material film within a contact hole region can be removed by a first thickness. Thereafter, the first photoresist pattern can be partially removed from the planarization material film through an ashing process. As such, a part of the photoresist pattern disposed on the first planarization film, which will be formed later, remains and is not completely removed from the planarization material film. Meanwhile, another part of the photoresist pattern disposed on the second planarization film, which will be formed later, is completely removed from the planarization material film.

Subsequently, the planarization material film is etched by a second thickness using the residual photoresist pattern disposed on the first planarization, which will be formed as an etch mask after the photoresist is semi-cured. As such, the first planarization film 112a which is the same as one portion of the planarization material film disposed under the residual photoresist pattern can be formed. Also, the second planarization film 112b which is the same as the partially etched portion of planarization material film can be formed. The second planarization film 112b is formed to have a lower height (or a smaller thickness) than that of the first planarization film 112a. In other words, a recess (or a depressed portion) is formed in the planarization film 112 within the second non-emission region NA2. Moreover, a contact hole A can be simultaneously formed at the formation of the second planarization film 112b.

Referring to FIG. 6C, a first electrode material layer is formed on the substrate 100 provided with the planarization film 112. The first electrode material layer can be patterned into a first electrode 103 by being etched through a photolithography process. Such a first electrode 103 can be disposed on the first planarization film 112a. Afterward, a first bank material film is formed on the substrate 100 in which the first electrode 103 is formed. The first bank material can be a hydrophilic material.

The first bank material film is patterned into a first bank pattern 104 by being etched through the photolithography process. The first bank pattern 104 can be disposed in such a manner as to not only expose a part of the upper surface of the first electrode 103 within the emission region AA but also cover the second planarization film 112b within the second non-emission region NA2.

Subsequently, a second bank material film is formed on the substrate 100 provided with the first bank pattern 104. The second bank material can be a hydrophobic material. Thereafter, the second bank material film is patterned into a second bank pattern 105 by being etched through the photolithography process. The second bank pattern 105 is disposed on the first bank pattern 104 covering the second planarization film 112b within the second non-emission region NA2.

In this way, the second planarization film 112b with the lowered height can be disposed in the second non-emission region NA2. In other words, the recess (or the depressed portion) can be formed in the planarization film 112 within the second non-emission region NA2. As such, the height (or thickness) of the second bank pattern 105 with hydrophobicity can be lowered (or become smaller). In accordance therewith, the organic emission layer 106 can be formed to have a flattened (or planarized) surface. Also, the height of the second bank pattern 105 disposed in the contact hole A which is formed in the planarization film 112 can be lowered. Therefore, the generation of the curling phenomenon of the second bank pattern 105 due to an etchant used in a photolithography process can be prevented.

Figure 7:
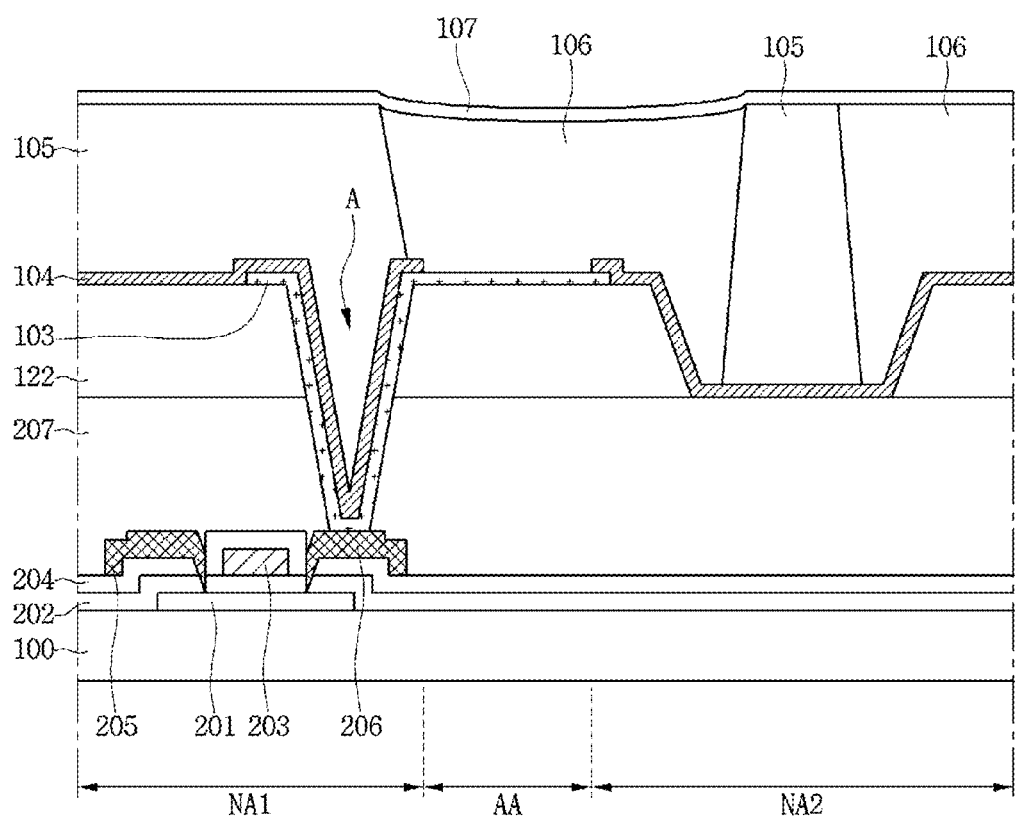
FIG. 7 is a cross-sectional view showing a thin film transistor array substrate of an OLED display device according to a third embodiment of the present invention.

FIG. 7 illustrates a thin film transistor array substrate of an OLED display device according to a third embodiment of the present invention. In further detail, FIG. 7 is a cross-sectional view illustrating a thin film transistor array substrate of an OLED display device according to the third embodiment of the present invention. The thin film transistor array substrate of the OLED display device of the third embodiment can have the same components as those of the previous embodiments. As such, the description of the third embodiment overlapping with the previously described embodiments will be omitted. Also, the components of the third embodiment being the same shape and function as those of the previous embodiments will be referred to by the same reference numbers and names.

Referring to FIG. 7, a thin film transistor array substrate of the OLED display device according to the third embodiment of the present invention includes an emission region AA, a first non-emission region NA1 and a second non-emission region NA2. The first non-emission region NA1 is used as a driver region in which a thin film transistor is disposed. The second non-emission region NA2 corresponds to the rest of a pixel region with the exception of the emission region AA and the first non-emission region NA1.

A planarization film 122 is disposed on a substrate 100 in which the thin film transistor is formed. The planarization film 122 is disposed on the substrate 100 except for a part of the substrate 100 in the second non-emission region NA2. An opening can be formed in the planarization film 122 by removing a part of the planarization film 122 in the second non-emission region NA2.

Also, a first electrode 103 of an organic light emitting element connected to a drain electrode 206 of the thin film transistor is disposed on the planarization film 122. A first bank pattern 104 can be disposed in the first and second non-emission regions NA1 and NA2 of the substrate 100 provided with the first electrode 103 of the organic light emitting element. In other words, the first bank pattern 104 is disposed in the opening within the second non-emission region NA2.

Moreover, a second bank pattern 105 can be disposed in such a manner as to overlap with the first bank pattern 104 covering the opening. In other words, the first bank pattern 104 can be disposed in the opening and the second bank pattern 105 can be disposed on the first bank pattern 104. As such, the height (or thickness) of the second bank pattern 105 can be lowered (or become smaller). The second bank pattern 105 is also disposed in a contact hole A which is formed in the planarization film 122 and used to connect the first electrode 103 and the drain electrode 206. The height (thickness) of the second bank pattern 105 disposed in the contact hole A can also be lowered (or become smaller). In accordance therewith, the generation of a curling phenomenon of the second bank pattern 105 in a photolithography process which is used for patterning the second bank pattern 105 can be prevented.

Figure 8:
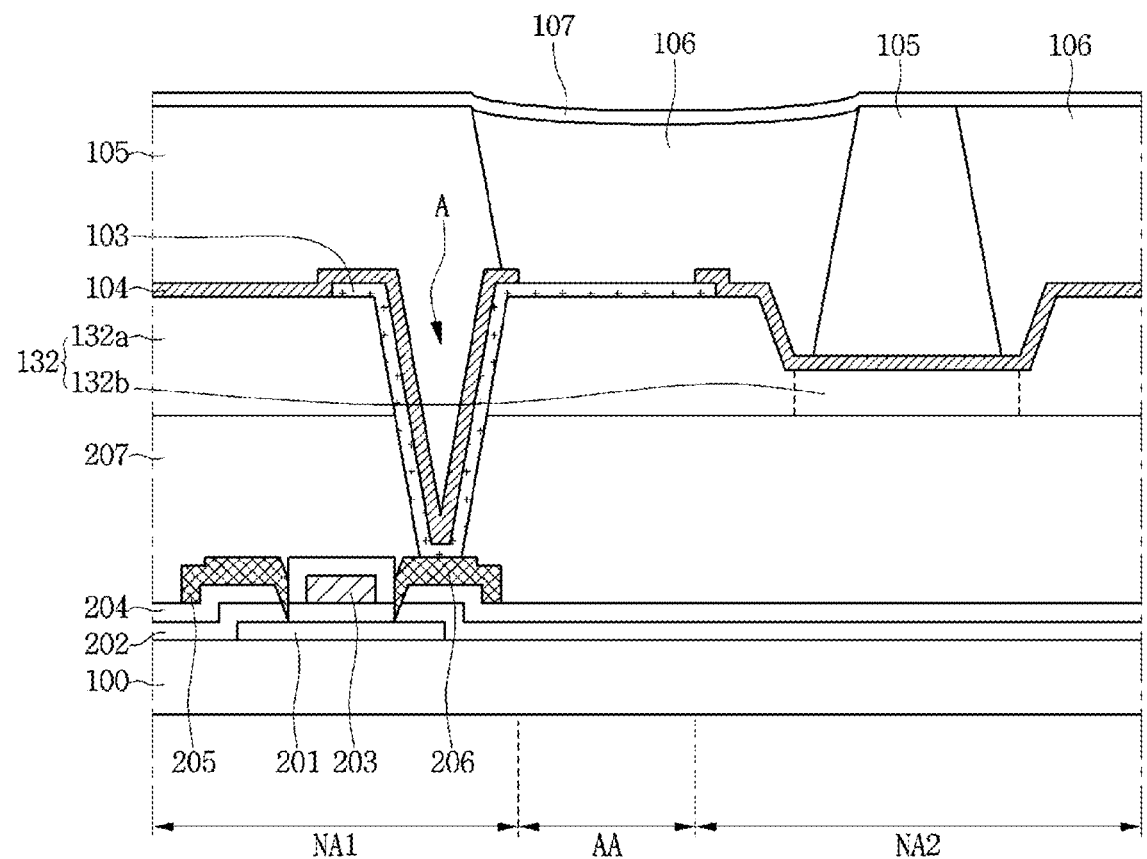
FIG. 8 is a cross-sectional view showing a thin film transistor array substrate of an OLED display device according to a fourth embodiment of the present invention.

Next, FIG. 8 illustrates a thin film transistor array substrate of an OLED display device according to a fourth embodiment of the present invention. In further detail, FIG. 8 is a cross-sectional view illustrating a thin film transistor array substrate of an OLED display device according to the fourth embodiment of the present invention. The thin film transistor array substrate of the OLED display device of the fourth embodiment can have the same components as that of the previous embodiments. As such, the description of the fourth embodiment overlapping with the previously described embodiments will be omitted. Also, the components of the fourth embodiment being the same shape and function as those of the previous embodiments will be referred to by the same reference numbers and names.

Referring to FIG. 8, a thin film transistor array substrate of an OLED display device according to the fourth embodiment of the present invention is defined into an emission region AA, a first non-emission region NA1 and a second non-emission region NA2. A planarization film 132 is disposed on a substrate 100 in which a thin film transistor is disposed. The planarization film 132 includes a first planarization film 132a and a second planarization film 132b.

The first planarization film 132a is disposed in the rest of the substrate 100 with the exception of a part of the second non-emission region NA2. In other words, an opening can be formed in the first planarization film 132a within the second non-emission region NA2 by removing a part of the first planarization film 132a from the second non-emission region NA2. Meanwhile, the second planarization film 132b is disposed in the opening. The second planarization film 132b is formed to have a lower height than that of the first planarization film 132a. Consequently, a recess (or a depressed portion) is formed in the planarization film 132 within the second non-emission region NA2.

A first bank pattern 104 and a second bank pattern 105 overlapping with the first bank pattern 104 are sequentially disposed on the second planarization film 132b with the low height (or small thickness). In accordance therewith, the height (or thickness) of the second bank pattern 105 can be lowered (or become smaller). The second bank pattern 105 overlapping with the first bank pattern 104 is also disposed in a contact hole A which is formed in the planarization film 132 and used to connect a first electrode 103 and a drain electrode 206. Also, the height (thickness) of the second bank pattern 105 disposed in the contact hole A can be lowered (or become smaller). In accordance therewith, the generation of a curling phenomenon of the second bank pattern 105 in a photolithography process which is used for patterning the second bank pattern 105 can be prevented.

Figure 9:
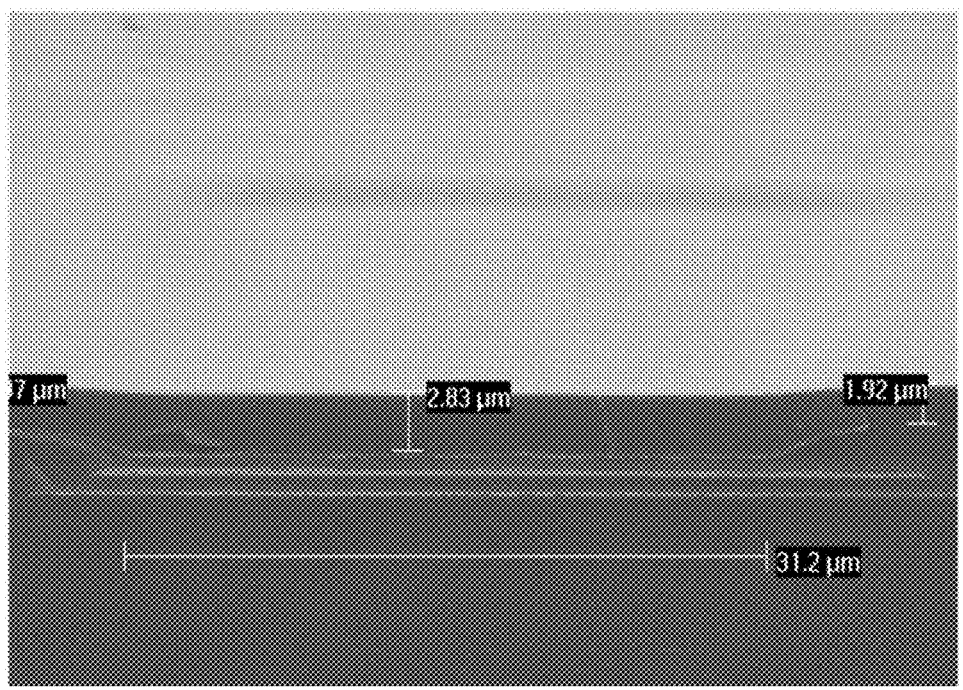
FIG. 9 is a photograph showing a non-emission region of a thin film transistor array substrate of an OLED display device according to a fifth embodiment of the present invention.

FIG. 9 is a photograph illustrating a non-emission region of a thin film transistor array substrate of an OLED display device according to an embodiment of the present invention. As illustrated in FIG. 9, an opening with a width of about 32.1 μm is formed in a planarization film within a non-emission region. Also, one portion of a second bank pattern disposed in the opening of the planarization film is formed in a height (or thickness) of about 2.83 μm. Meanwhile, another portion of the second bank pattern disposed on the planarization film is formed in another height (thickness) of about 1.92 μm. In other words, because the planarization film is removed from the non-emission region by at least a fixed thickness, an organic emission layer can be formed to have a flattened (or planarized) surface.

The above-mentioned features, structures, effects and so on of the present invention are included in at least one embodiment without being limited to only a single embodiment. Although the present invention has been explained regarding only the embodiments described above, it should be understood by the ordinary skilled person in the art that the present invention is not limited to these embodiments. Rather, various changes or modifications thereof are possible without departing from the spirit of the present invention. More particularly, various variations and modifications are possible in the component parts which are described in the embodiments. Accordingly, the scope of the present invention shall be determined only by the appended claims and their equivalents without being limited to the detailed description.

What is claimed is:

1. An organic light emitting diode (OLED) display device, comprising:
    a substrate formed in an emission region and a non-emission region;
    an organic emission layer formed on the substrate in the emission region;
    a planarization film formed on the substrate in the emission region and the non-emission region;
    a first bank pattern formed on the substrate in the emission region and having a portion in an opening of the planarization film in the non-emission region; and
    a second bank pattern formed on the first bank pattern and having a portion in the opening of the planarization film in the non-emission region, a bottom surface of the portion of the second bank pattern being wider than a top surface of the portion of the second bank pattern.

2. The OLED display device according to claim 1, wherein the portion of the first bank pattern in the opening of the planarization film is a concave portion, and the portion of the second bank pattern is formed above the concave portion of the first bank pattern.

3. The OLED display device according to claim 2, wherein a center of the portion of the second bank pattern is horizontally aligned with a center of the opening of the planarization film.

4. The OLED display device according to claim 3, wherein the bottom surface of the portion of the second bank pattern that is wider than the top surface of the portion of the second bank pattern is positioned above a part of each of first and second color filter patterns.

5. The OLED display device according to claim 1, further comprising:
    a color filter layer formed directly below the first bank pattern in the non-emission region, the color filter layer including color filter patterns,
    wherein a boundary region between the color filter patterns is below the opening of the planarization film.

6. The OLED display device according to claim 5, wherein the planarization film is not disposed above the boundary region between the color filter patterns.

7. The OLED display device according to claim 5, wherein the first bank pattern includes a concave portion to contact a thin portion of the planarization film that is in the opening of the planarization film.

8. The OLED display device according to claim 1, further comprising:
    a thin film transistor formed on the substrate in another non-emission region;
    a first electrode formed on the thin film transistor; and
    a contact hole formed in the another non-emission region to connect the first electrode to the thin film transistor.

9. The OLED display device according to claim 8, wherein another portion of each of the first and second bank patterns is disposed on the first electrode in the contact hole.

10. The OLED display device according to claim 9, wherein an edge of a concave portion of the first bank pattern formed in the non-emission region overlaps the first electrode at a side of the emission region, and an edge of another concave portion of the first bank pattern formed in the another non-emission region overlaps the first electrode at another side of the emission region.

11. An organic light emitting diode (OLED) display device, comprising:
a substrate;
a first bank pattern formed on the substrate and in an emission region and a non-emission region;
a second bank pattern formed on the first bank pattern;
an organic emission layer formed on the substrate in the emission region;
a planarization film formed on the substrate to include an opening under the first and second bank patterns in the non-emission region, wherein the second bank pattern is on the first bank pattern in the non-emission region, and the first bank pattern is in the opening of the planarization film in the non-emission region; and
a color filter layer formed directly below the first bank pattern in the non-emission region, the color filter layer including color filter patterns,
wherein a boundary region between the color filter patterns is below the opening of the planarization film.

* * * * *